(12) United States Patent
Ma et al.

(10) Patent No.: US 7,895,584 B1
(45) Date of Patent: Feb. 22, 2011

(54) TRANSLATION OF A PROGRAM IN A DYNAMICALLY-TYPED LANGUAGE TO A PROGRAM IN A HARDWARE DESCRIPTION LANGUAGE

(75) Inventors: Haibing Ma, Superior, CO (US); L. James Hwang, Menlo Park, CA (US); Jeffrey D. Stroomer, Lafayette, CO (US); Roger B. Milne, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 2470 days.

(21) Appl. No.: 10/389,368

(22) Filed: Mar. 14, 2003

(51) Int. Cl.
*G06F 9/45* (2006.01)

(52) U.S. Cl. .................. 717/144; 717/137; 717/156; 717/158

(58) Field of Classification Search .............. 717/136, 717/156
See application file for complete search history.

(56) References Cited

U.S. PATENT DOCUMENTS

| | | | | |
|---|---|---|---|---|
| 5,884,083 | A * | 3/1999 | Royce et al. ............... | 717/143 |
| 6,029,005 | A * | 2/2000 | Radigan ..................... | 717/158 |
| 6,381,736 | B1 * | 4/2002 | Klotz et al. ................. | 717/114 |
| 6,571,387 | B1 * | 5/2003 | Chow et al. ................. | 717/156 |
| 6,957,423 | B1 * | 10/2005 | Ma ............................. | 717/137 |
| 6,993,751 | B2 * | 1/2006 | Bhansali et al. ............. | 717/137 |
| 7,117,488 | B1 * | 10/2006 | Franz et al. .................. | 717/144 |
| 7,370,321 | B2 * | 5/2008 | Radigan ...................... | 717/144 |
| 2004/0019883 | A1 * | 1/2004 | Banerjee et al. ............. | 717/152 |
| 2004/0088666 | A1 * | 5/2004 | Poznanovic et al. ......... | 716/7 |

OTHER PUBLICATIONS

"Algorithms for computing the static single assignment form", Bilardi et al., May 2003, pp. 375-425, <http://delivery.acm.org/10.1145/770000/765573/p375-bilardi.pdf>.*

"Data communication estimation and reduction for reconfigurable systems", Kaplan et al., Jun. 2003, pp. 616-621, <http://delivery.acm.org/10.1145/780000/775987/p616-kaplan.pdf>.*

"Static single assignment form for machine code", Leung et al., May 1999, pp. 204-214, <http://delivery.acm.org/10.1145/310000/301667/p204-leung.pdf>.*

P. Banerjee et al.; "A MATLAB Compiler for Distributed, Heterogeneous, Reconfigurable Computing Systems"; Electrical and Computer Engineering Northwestern University, Evanston, IL; pp. 1-10.

(Continued)

*Primary Examiner*—Thuy Dao
(74) *Attorney, Agent, or Firm*—LeRoy D. Maunu

(57) ABSTRACT

Method and apparatus for translating a first program in a dynamically-typed language to a program in a hardware description language. From the dynamically-typed-language first program, a second program in single static assignment format is generated. For cases where a variable is assigned different data types at different places in the program, the assignments of the different data types are resolved for the variable. The second program is then translated to a program in the hardware description language.

13 Claims, 4 Drawing Sheets

OTHER PUBLICATIONS

C. Scott Ananian; "Reconfigurable Cryptography—A Hardware Compiler for Cryptographic Applications"; May 12, 1997; selected pages; downloaded from: http://www.cag.lcs.mit.edu/ ~canarian/Projects/ele580a/writeup.html; 13 pages.

U.S. Appl. No. 10/388,681, filed Mar. 14, 2003, Milne et al.
U.S. Appl. No. 10/388,936, filed Mar. 14, 2003, Milne et al.
U.S. Appl. No. 10/389,161, filed Mar. 14, 2003, Milne et al.

* cited by examiner

```
                                          ┌ 250
    begin
    .
    .
    .
    if (x1>y1)              (201')
       then z1 = x1;         (202')
       else z2 = y1;         (203')
    z3 = φ(z1,z2)            (204')
    q1 = z3;                 (204')
    .
    .
    .
    end
```

```
                                          ┌ 290
    begin
    .
    .
    .
    if (x1>y1)              (201')
       then {                (202')
          z1 = x1            (202')
          z3 = z1   }        (202')
       else {                (203')
          z2 = y1;           (203')
          z3 = z2;  }        (203')
    q1 = z3;                 (204')
    .
    .
    .
    end
```

⎧ 400

.
.
.
```
  variable x_x_0 : unsigned (11 - 1 downto 0);
  variable y_x_0 : signed (10 - 1 downto 0);
  variable z_x_0 : signed (12 - 1 downto 0);
  variable z_x_1 : signed (12 - 1 downto 0);
  variable z_x_2 : unsigned (11 - 1 downto 0);
  variable z_x_3 : signed (10 - 1 downto 0);
```
.
.
.
```
begin
  x_x_0 := std_logic_vector_to_unsigned (x);
  y_x_0 := std_logic_vector_to_signed (y);
  if u2s_cast (x_x_0, 7, 12, 7) > s2s_cast (y_x_0, 5, 12, 7) then
    z_x_2 := x_x_0;
    z_x_1 := u2s_cast (z_x_2, 7, 12, 7);
  else
    z_x_3 := y_x_0;
    z_x_1 := s2s_cast (z_x_3, 5, 12, 7);
  end if;
  z <= signed_to_std_logic_vector (z_x_1);
end;
```
.
.
.

FIG. 5

TRANSLATION OF A PROGRAM IN A DYNAMICALLY-TYPED LANGUAGE TO A PROGRAM IN A HARDWARE DESCRIPTION LANGUAGE

FIELD OF THE INVENTION

The present invention generally relates to translation of programs from a dynamically-typed language to a hardware description language.

BACKGROUND

The increasing capabilities and resources of integrated circuits, for example, ASICs and FPGAs, are making hardware implementations viable for some software designs. That is, some designs formerly implemented as software for execution on a processor may now be feasibly implemented as hardware. The re-programmability of devices such as FPGAs makes these types of devices especially attractive for a hardware implementation.

To re-implement a software design in hardware, the logic of the software program code must be recast in hardware terms, for example as a description in a hardware description language (HDL). The difficulty with which program code may be recast in HDL depends in part on the language in which the program is written, in addition to the specific application. For example, some programs are written in dynamically-typed languages. A dynamically-typed language allows the type of a variable to be changed with each assignment to that variable. The type of a variable is changed to the type of the right-hand side of an expression in an assignment statement. Example dynamically-typed languages include Matlab and Perl.

HDLs are generally strongly-typed. In a strongly-typed language the type of a variable does not change for the lifetime of the variable, and a variable may only be assigned with expressions that result in a compatible type. Thus, translation of a program from a dynamically-typed language to HDL is not straightforward.

A system and method that address the aforementioned problems, as well as other related problems, are therefore desirable.

SUMMARY OF THE INVENTION

The various embodiments of the invention translate a first program in a dynamically-typed language to a program in a hardware description language. From the dynamically-typed-language first program, a second program in single static assignment format is generated. For cases where a variable is assigned different data types at different places in the program, the assignments of the different data types are resolved for the variable. The second program is then translated to a program in the hardware description language.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 5 illustrates example HDL code generated from the example SSA code.

DETAILED DESCRIPTION

Figure 1:
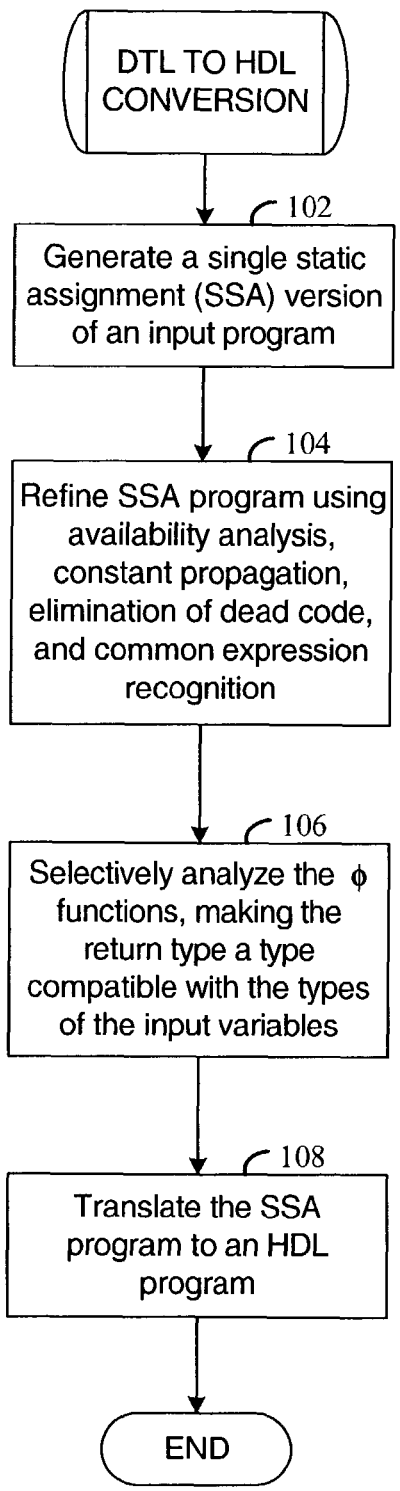
FIG. 1 is a flowchart of an example process for translating a program in a dynamically-typed language to code in a HDL.

FIG. 1 is a flowchart of an example process for translating a program in a dynamically-typed language to code in an HDL. The process generates a static single assignment version of a program from a selected dynamically-typed program (step 102). This is accomplished by first creating a control flow graph of the input program.

Figure 2A:
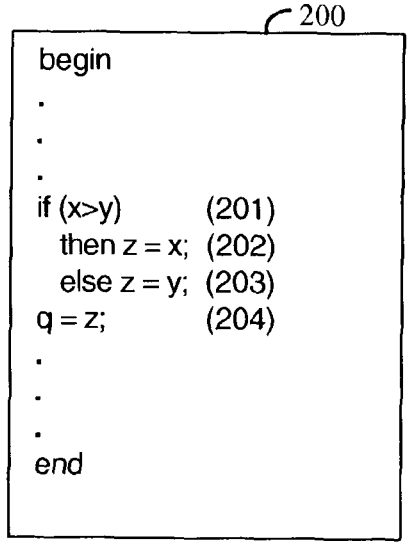
FIG. 2A illustrates an example sequence of code in a dynamically-typed language.
Figure 2B:
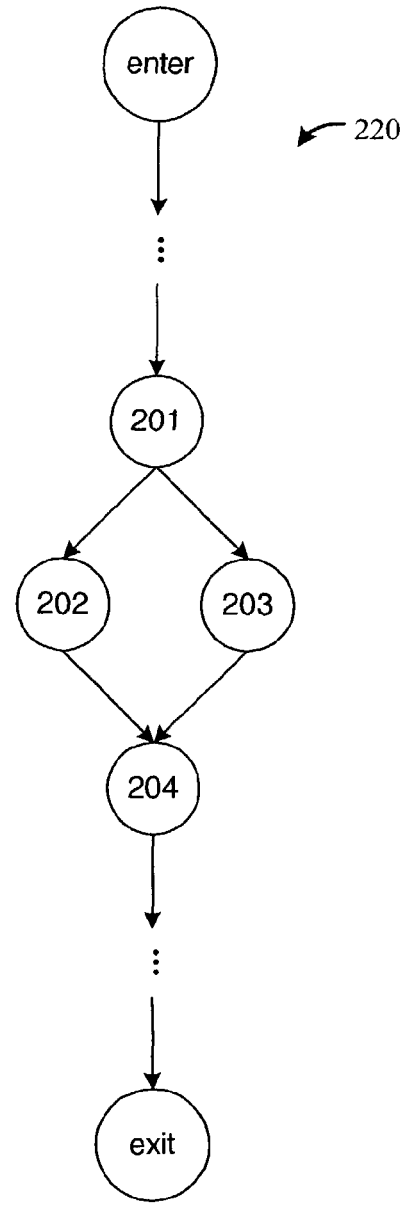
FIG. 2B illustrates a control flow graph constructed from the example code of FIG. 2A.

FIG. 2A illustrates example code 200 from which a control graph 220 of FIG. 2B is generated. The control flow graph may be generated using known techniques. Each node in the graph corresponds to a block of code. Blocks of code are demarcated by redirection of control flow. An edge in the graph represents the flow of control from one block of code to another block.

The if statement in code 200 corresponds to node 201, from which control is directed to either of nodes 202 or 203, depending on how the condition x>y evaluates. Node 202 corresponds to the z=x statement, and node 203 corresponds to the z=y statement. The control paths from nodes 202 and 203 join at node 204, which illustrates a "join point." Node 204 corresponds to the q=z statement. The control graph 220 may then be analyzed, and known techniques used to generate the SSA form of the program.

Figures 3A, 3B, 4:
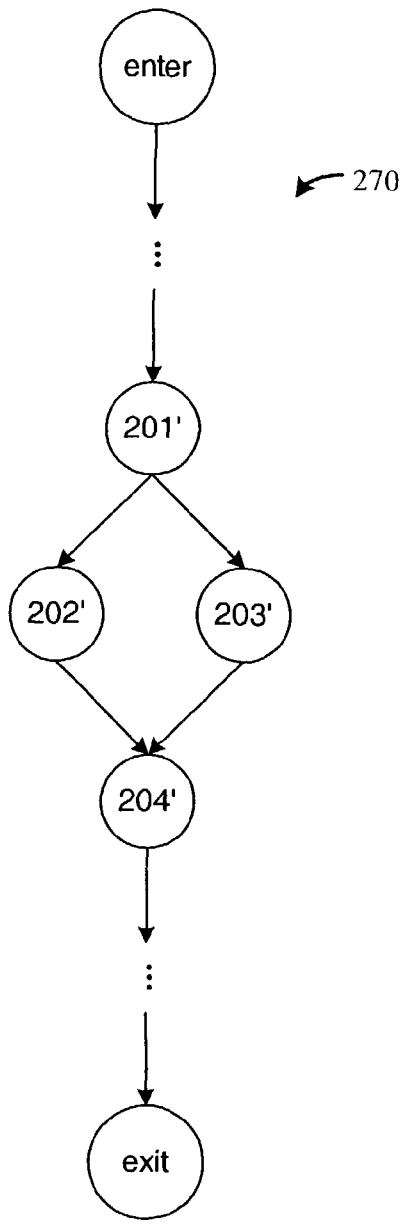
FIG. 3A illustrates the example code of FIG. 2A in static single assignment (SSA) form.
FIG. 3B illustrates the corresponding control flow graph.
FIG. 4 illustrates code that results from semantic analysis of the example SSA code of FIG. 3A.

FIG. 3A illustrates the example code of FIG. 2A in SSA form 250, and FIG. 3B illustrates the corresponding control flow graph 270. In SSA form, each variable receives exactly one assignment during its lifetime. Thus, multiple assignments to a variable in the original code result in renaming of the variable in the SSA form. For example, in the original code, there are multiple assignments to the variable z, and z is renamed in these assignments to z1 and z2. It will be appreciated that x, y, and q from code 200 have been renamed x1, y1, and q1, respectively, in code 250 under the assumption that x, y, and q receive multiple assignments in the original code 200.

In the blocks of code that correspond to join points in the control flow graph, assignments of phi functions ("$\phi()$") to renamed variables are inserted to represent the merging semantics for variables. For example, node 204' corresponds to a join point, and a $\phi()$-function statement is inserted at the beginning of the block (before q1=z3) that corresponds to node 204'. Each $\phi()$-function statement is specified as an assignment of the $\phi()$ function to a "composite version" of a renamed variable. The parameters to the $\phi()$ function are other versions of the renamed variable having type-defining occurrences in blocks leading into the join point. For example, in original code 200, the variable z has renamed versions z1 and z2 corresponding to nodes 202' and 203' that lead to the join point. An additional renamed version Z3 is the variable to which the $\phi()$ function is assigned. For purposes of this discussion, z3 is the composite version of the renamed variable z.

Nodes that represent empty blocks are also inserted in the graph at selected points. The empty blocks are used later in the transformation. Specifically, a node is inserted to represent an empty block of code so that for a node having multiple immediate predecessors, one immediate predecessor of the node is not also an immediate predecessor of others of the immediate predecessors. An example where a node would be inserted for an empty block is if in original code 200 there was not an else clause to the if statement. In this example graph 220 would not have a node 203, and there would be an edge from node 201 directly to node 204. The process would insert a node 203 to represent an else clause with no associated program statements.

The $\phi(\ )$ function statements are used to resolve dynamic typing issues in the translation to HDL. If a variable is assigned different data types in different control paths, when the program progresses to the join point during execution, the type of the variable will depend on the control path followed in the program. Therefore, in translating a dynamically-typed program without knowing the execution path, the type of a variable having assignments of different data types is unknown at a join point in the program.

Returning now to the process of FIG. 1, various analyses are optionally performed on the SSA version of the program (step 104). These analyses are optional in that another tool (downstream) may be used to identify errors or optimize the HDL once the SSA has been converted. Each analysis may be performed using known techniques.

One of the analyses is availability analysis. If a variable is referenced before a value has been assigned, then an error is flagged and the translation is aborted.

Another error analysis is type checking. That is, in an expression the type of a variable must be compatible with the associated operator.

Another analysis is checking for constant propagation. An example of constant propagation is a code sequence in which, x=K1 ... y=K2 ... z=x+y, where K1 and K2 are constants and neither x nor y are assigned different constant values before the sum is assigned to z. In optimizing the code, z=x+y is replaced with the z=K12, where K12 is a pre-computed constant K1+K2.

Another analysis eliminates dead code. Code is eliminated if the presence or absence of the code in the program would not affect any result in executing the program. Examples include an if statement that always evaluates to true or a case statement that always evaluates to the same switch.

Common expressions are recognized in optimizing the code. For example, if an expression is repeated in the code, a statement is inserted that assigns the result of the expression to a variable, and the variable is substituted for the expression elsewhere in the code. For example, for the instruction sequence x=a+b+c; y=a+b; a new statement temp1=a+b is inserted, and a+b is replaced with temp1. The new code sequence is: temp1=a+b; x=temp1+c; y=temp1.

After refining the SSA program, the $\phi(\ )$ functions are selectively analyzed (step 106), and the SSA code is supplemented with assignment statements at each assignment to a renamed variable that is an argument to a $\phi(\ )$ function. Those $\phi(\ )$ functions that are analyzed include those in which the composite version of a renamed variable is referenced elsewhere in the program, or the composite version is the return value or output parameter of a function. If the composite version is not referenced elsewhere in the program, the associated $\phi(\ )$ function is not analyzed, and the $\phi(\ )$ function statement is removed.

FIG. 4 illustrates code 290 that results from this analysis of the example SSA code 250 of FIG. 3A. It will be appreciated that the control flow graph 270 of FIG. 3B is representative of both the code 250 and 290. An objective of this phase of the process is to analyze the $\phi(\ )$ functions and determine suitable data types for purposes of allocating storage for renamed variables based on the input arguments.

Examples of different data types include: signed/unsigned integer, signed/unsigned fixed point, complex, floating point, Boolean, and string. The data type that is established for the composite version of the renamed variable is that which is compatible with all data types of the input arguments to the $\phi(\ )$ function and minimally necessary to accommodate the storage requirements of the different data types. Numeric types are compatible one with another (signed/unsigned integer, signed/unsigned fixed point, complex, and floating point), a Boolean type is compatible only with the Boolean type, and a string type is compatible only with the string type. It will be appreciated that although specific example data types are named above, the techniques described herein could be applied to other data types that are compatible.

For a $\phi(\ )$ function in which any of the arguments is a complex type, the type of the renamed variable is also complex. For a $\phi(\ )$ function in which any of the arguments is a floating point type and none of the arguments is a complex type, the type of the renamed variable is also floating point. If the arguments do not include either a complex type or a floating point type but include an argument of the type signed fixed point, the type of the renamed variable is made to be a signed fixed point. As between arguments of the types unsigned signed/unsigned fixed point and signed/unsigned integer, the renamed variable is made to be signed/unsigned fixed point. An error is flagged and the translation is aborted if incompatible data types are found in a $\phi(\ )$ function.

The $\phi(\ )$ function statements are then removed from the code, and suitable assignment statements are respectively inserted at the end of the blocks that immediately precede the join points at which the $\phi(\ )$ functions were initially inserted. For example, the statement z3=z1 is inserted at the end of the 202' block, and the statement z3=z2 is inserted at the end of the 203' block.

An assignment statement is also inserted for each node that represents an empty block of code (empty blocks described above in association with FIG. 3A). For example, if the initial program code sequence is:

...
if (x>y)
then z=x;
endif;
...

The SSA form of the code sequence would be:

...
if (x1>y1)
then z1=x1;
endif;
z2=$\phi$(z1,z0);

When the $\phi(\ )$ function is removed and assignment statements are inserted at blocks before the join point, the resulting code is:

...
if (x1>y1)
then z1=x1;
   z2=z1;
else z2=z0;
endif;
...

The inserted else clause and associated assignment statement ensure that the variable z2 takes on a data type after execution of the if-then-else code.

The SSA program 290 is then translated to HDL code (FIG. 1, step 108) using known techniques. The translator generates HDL code for making the appropriate translations from one data type to another, for example, from z1 to z3 and from z2 to z3 from the example code 290. If z1 and z2 were of the type integer (signed or unsigned) and signed fixed point, respectively, then z3 is established as the signed fixed point type. In translating the SSA program to HDL, the statement that assigns z1 to z3 is translated to HDL code that also converts an integer format (z1) to a signed fixed point format (z3). No supplemental code is needed for the z3=z2 statement because z2 is of the type signed fixed point. It will be appreciated that if z1 and z2 were instead both signed fixed point numbers having different widths and binary point positions, the HDL code would include any code needed for aligning z1 or z2 with z3.

FIG. 5 illustrates example HDL code 400 generated from the example SSA code 290. The HDL code assumes that the variable x in the SSA code 290 is an unsigned fixed-point number that is 11 bits wide and has 7 bits after the binary point. The variable y is assumed to be a signed fixed-point number that is 10 bits wide and has 5 bits after binary point. The type of z is determined by the translator to be a signed fixed-point number that is 12 bits wide and has 7 bits after the binary point.

In the HDL code 400, the input/output ports are std logic vectors, but the comparison is performed on an HDL signed number. Thus, some functions are used to convert a variable from the std_logic_vector type to a signed number type, and the convert back to the std_logic_vector type. The function, std_logic_vector_to_unsigned(x), converts the input argument x from the type, std_logic_vector, to an unsigned number. The function, std_logic_vector_to_unsigned(y), converts the input argument y from the type, std_logic_vector, to a signed number.

The two functions for converting unsigned and signed fixed point numbers from one size to another are the u2s_cast( ) and s2s_cast( ) functions. The u2s_cast( ) function converts from unsigned to signed format and is called as:
u2s_cast(value, old_bin_point_position, new_width, new_binary_point_position) where value is the number value to be converted, old_bin_point_position is the binary point position of the input unsigned number, new_width is the width of the output signed number, and new_binary_point_position is the binary point position of the output signed number.

The s2s_cast( ) function converts a signed number to a different width and/or binary point position and is callable as:
s2s_cast(value, old_binary_point_position, new_width, new_binary_point_position)
where value is the input number value to be converted, old_bin_point_position is the binary point position of the input signed number, new_width is the width of the output signed number, and new_binary_point_position is the binary point position of the output signed number.

The function, signed_to_std_logic_vector converts the HDL signed number to the type, std_logic_vector.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for translating code from a dynamically-typed language to HDL code and has been found to be particularly applicable and beneficial in translating code from a high-level modeling language to HDL code. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for translating a first program in a dynamically-typed language to a second program in a hardware description language, comprising:

generating a control flow graph of the first program, the graph having nodes that represent blocks of code and edges that represent control flow between the blocks of code;

generating a static single assignment (SSA) program from the first program and the control flow graph, wherein assignments of $\phi(\ )$ functions to respective renamed variables are inserted at blocks of code that correspond to join points in the graph, and each $\phi(\ )$ function is specified with input arguments corresponding to type-defining occurrences of a variable that is visible at the join point;

wherein each input argument in at least one $\phi(\ )$ function corresponds to a different data type assigned to the variable;

resolving type differences between arguments to the $\phi(\ )$ functions;

wherein resolving comprises for each variable having assignments of different data types, defining a renamed variable to be of a composite data type that is sufficient for storage of each of the different data types;

inserting, for each $\phi(\ )$ function, assignment statements in the blocks of code that correspond to nodes leading to the join points in the graph, and removing each $\phi(\ )$ function from the SSA program, each assignment statement being an assignment of a type-defining occurrence of a variable, in the block of code that corresponds to the node leading to a join point, to a renamed variable; and translating the SSA program to the second program in the hardware description language.

2. The method of claim 1, wherein translating further comprises generating HDL code that translates from each different data type to the composite data type.

3. The method of claim 1, wherein the composite data type is a complex data type if any of the different data types assigned to a variable is a complex data type.

4. The method of claim 3, wherein the composite data type is a floating point data type if none of the different data types assigned to a variable is a complex data type, and at least one of the different data types assigned to a variable is a floating point data type.

5. The method of claim 4, wherein the composite data type is a signed fixed point data type if none of the different data types assigned to a variable is either a complex data type or a floating point data type, and at least one of the different data types assigned to the variable is a signed fixed point data type.

6. The method of claim 5, wherein the composite data type is an unsigned fixed point data type if none of the different data types assigned to a variable is either a complex data type, a floating point data type, or a signed fixed point data type, and at least one of the different data types assigned to the variable is an unsigned fixed point data type.

7. The method of claim 1, further comprising aborting the translating step if the different data types assigned to a variable include at least one numeric type and at least one non-numeric type.

8. The method of 1, further comprising aborting translation and indicating an error if a variable in the second program is referenced before a value has been assigned.

9. The method of claim 1, further comprising analyzing the second program for expressions that propagate constant values, and replacing each expression that propagates a constant value with a pre-computed constant.

10. The method of claim 1, further comprising:

analyzing the second program for dead code segments, wherein a dead code segment is a segment for which the presence or absence of the code segment in the second program would not affect any result in executing the second program; and removing dead code segments from the second program.

11. The method of claim 1, further comprising for each expression that is repeated in the second program, selectively inserting a statement in which the expression is assigned to a variable and replacing occurrences of the expression with the variable.

12. The method of claim 1, further comprising aborting translation and indicating an error if a variable in an expression in the second program is a type that is incompatible with an associated operator in the expression.

13. The method of claim 1, further comprising bypassing resolution of type differences between arguments in a $\phi(\ )$ function if a renamed variable that is assigned a $\phi(\ )$ function is not subsequently referenced in the control flow graph.

* * * * *